(12) United States Patent
Chen

(10) Patent No.: US 7,471,514 B2
(45) Date of Patent: Dec. 30, 2008

(54) AUXILIARY COOLING DEVICE FOR MEMORY CHIPS

(75) Inventor: Wei-Hau Chen, Taipei (TW)

(73) Assignee: CompTake Technology Inc., Taipei County (TW)

( * ) Notice: Subject to any disclaimer, the term of this patent is extended or adjusted under 35 U.S.C. 154(b) by 38 days.

(21) Appl. No.: 11/822,046

(22) Filed: Jul. 2, 2007

(65) Prior Publication Data

US 2008/0298015 A1   Dec. 4, 2008

(30) Foreign Application Priority Data

Jun. 1, 2007   (TW) .............................. 96209080 U

(51) Int. Cl.
*H05K 7/20* (2006.01)
(52) U.S. Cl. .................... 361/695; 361/697; 361/715; 361/719; 257/712; 257/721; 257/722; 174/16.1; 174/16.3; 165/80.3; 165/104.33
(58) Field of Classification Search .................. None
See application file for complete search history.

(56) References Cited

U.S. PATENT DOCUMENTS

| | | | | |
|---|---|---|---|---|
| 5,883,426 A * | 3/1999 | Tokuno et al. | .............. | 257/686 |
| 6,130,820 A * | 10/2000 | Konstad et al. | ............. | 361/695 |
| 6,775,139 B2 * | 8/2004 | Hsueh | ......... | 361/697 |
| 6,781,833 B2 * | 8/2004 | Lu | ............. | 361/695 |
| 6,967,843 B2 * | 11/2005 | Rubenstein et al. | ......... | 361/703 |
| 7,023,701 B2 * | 4/2006 | Stocken et al. | ............. | 361/704 |
| 7,061,760 B2 * | 6/2006 | Hornung et al. | ............. | 361/695 |
| 7,130,191 B2 * | 10/2006 | Lin et al. | .................... | 361/695 |
| 7,151,668 B1 * | 12/2006 | Stathakis | .................... | 361/700 |
| 7,382,618 B2 * | 6/2008 | Peng et al. | .................. | 361/715 |
| 7,400,506 B2 * | 7/2008 | Hoss et al. | ................... | 361/715 |
| 2007/0008699 A1 * | 1/2007 | Strmiska et al. | ............. | 361/687 |
| 2008/0062652 A1 * | 3/2008 | Lieberman et al. | .......... | 361/715 |

* cited by examiner

*Primary Examiner*—Boris L Chervinsky

(57) ABSTRACT

An auxiliary cooling device includes two side boards with a space defined therebetween and the existed memory chips and the cooling plates on two sides of the memory chips are received in the space. A cooling fan is connected between the two side boards and sends air flows toward the memory chips and the cooling plates to remove heat via air paths defined in the inside of each side board.

4 Claims, 4 Drawing Sheets

AUXILIARY COOLING DEVICE FOR MEMORY CHIPS

BACKGROUND OF THE INVENTION (1) Field of the Invention

The present invention relates to an auxiliary cooling device for removing heat from the memory chips and the auxiliary cooling device is directly mounted to the existed cooling plates of the memory chips.

(2) Description of the Prior Art

Memory chips generate heat due to high speed of operation and the heat has to be removed to keep stable operation of the memory chips. A conventional cooling device for removing heat from the memory chips generally includes two cooling plates and the chips are clamped between the two cooling plates, the heat from the chips are conducted to the cooling plates and a fan is used to blow the heat away from the cooling plates. However, the latest computer systems are operated at an even higher speed and the heat generated is higher than the old systems so that an efficient cooling device is needed to remove the heat.

The present invention intends to provide an auxiliary cooling device which is mounted to the old cooling plates and the memory chips, and includes two side boards with air paths which allow the fan to blow the heat away from the device efficiently.

SUMMARY OF THE INVENTION

The present invention relates to an auxiliary cooling device and the auxiliary cooling device comprises two side boards and a space is defined between the two side boards so that the existed memory chips and cooling plates are accommodated in the space. Each of the two side boards has a through hole and a cooling fan is connected between the two side boards and located corresponding to the two respective through holes of the two side boards.

The primary object of the present invention is to provide an auxiliary cooling device which is mounted to existed cooling plates of memory chips and the auxiliary cooling device includes two side boards with air paths defined in insides thereof such that the heat from the memory chips is removed via the air paths by using a cooling fan.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENTS

Figure 1:
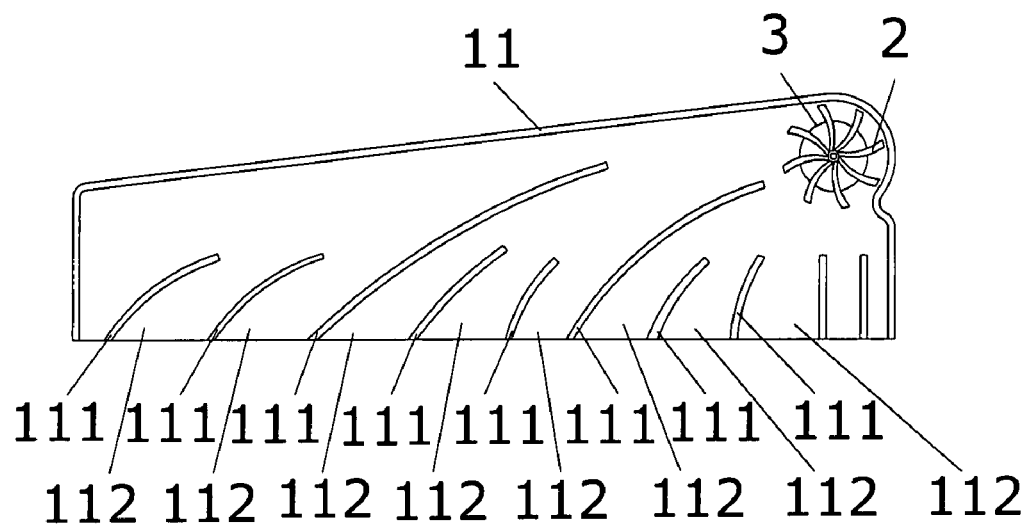
FIG. 1 shows the side board of the auxiliary cooling device of the present invention.
Figure 2:
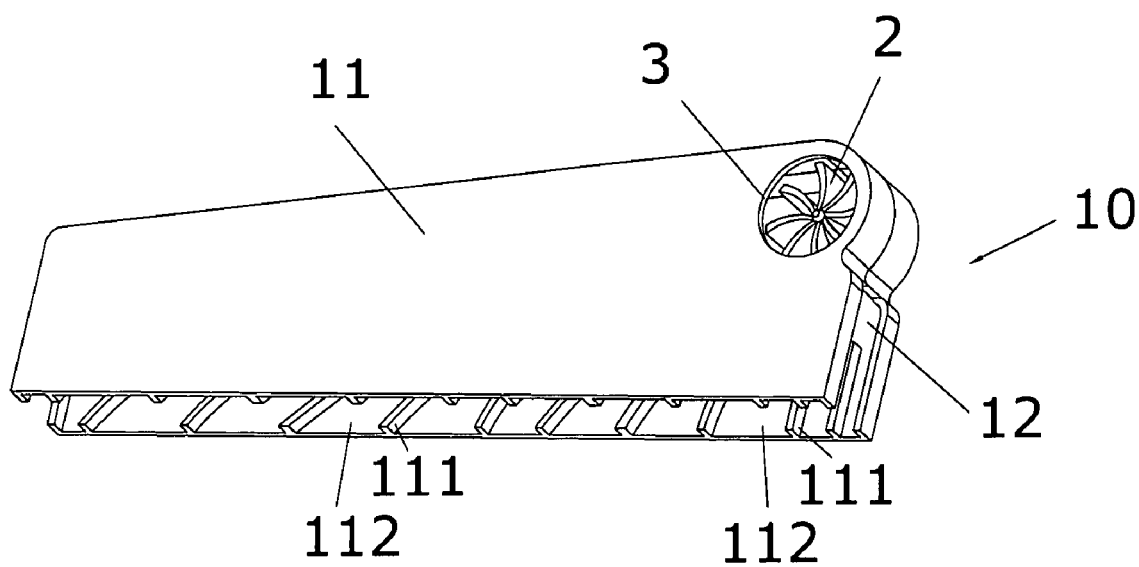
FIG. 2 is a perspective view to show the auxiliary cooling device of the present invention.
Figure 3:
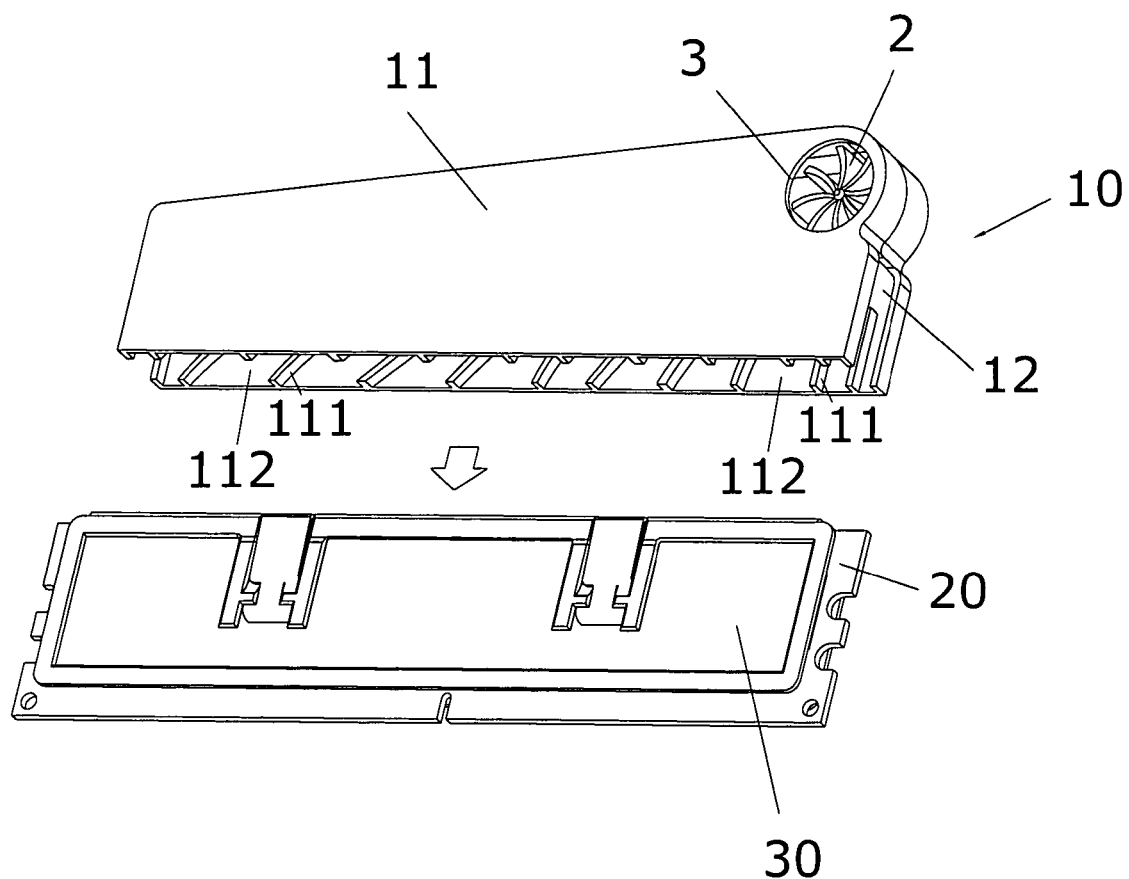
FIG. 3 is an exploded view to show the auxiliary cooling device of the present invention.
Figure 4:
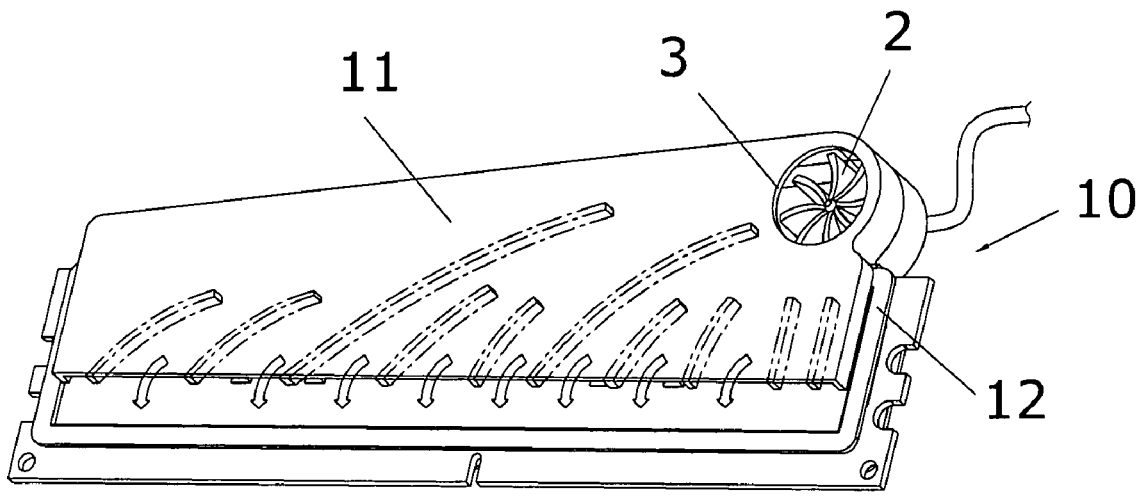
FIG. 4 shows that the auxiliary cooling of the present invention is mounted to the existed cooling plates and memory chips.

Referring to FIGS. 1 to 4, the auxiliary cooling device 10 of the present invention comprises two side boards 11 and a space 12 is defined between the two side boards 11. An open bottom is defined between the two side boards 11 of the auxiliary cooling device 10 and the existed memory chips 20 and cooling plates 30 on two sides of the memory chips 20 are inserted into the space 12 via the open bottom.

Each of the two side boards 11 has a through hole 3 and a cooling fan 2, such as a micro-fan is connected between the two side boards 11 and located corresponding to the two respective through holes 3 of the two side boards 11 so as to introduce air into the space 12 via the through holes 3. Each of the side boards 11 has a plurality of ribs 111 extending from an inside thereof and air paths 112 are defined between the ribs 111. The air paths 112 communicate with the open bottom.

The auxiliary cooling device 10 of the present invention can be easily mounted to the existed side panels 30 and the memory chips 20, and the cooling fan 2 sends air flows toward the side panels 30 and the memory chips 20 so as to bring heat away from the side panels 30 and the memory chips 20. The heat is sent out from the auxiliary cooling device 10 of the present invention via the air paths 112.

While we have shown and described the embodiment in accordance with the present invention, it should be clear to those skilled in the art that further embodiments may be made without departing from the scope of the present invention.

What is claimed is:

1. An auxiliary cooling device comprising:
  two side boards and a space defined between the two side boards, the space adapted to receive memory chips and cooling plates on two sides of the memory chips, each of the two side boards having a through hole, and
  a cooling fan connected between the two side boards and located corresponding to the two respective through holes of the two side boards.

2. The auxiliary cooling device as claimed in claim 1, wherein each of the side boards has a plurality of ribs extending from an inside thereof and air paths are defined between the ribs.

3. The auxiliary cooling device as claimed in claim 1, wherein the cooling fan is a micro-fan.

4. The auxiliary cooling device as claimed in claim 2, wherein the auxiliary cooling device includes an open bottom between the two side boards and the air paths communicate with the open bottom.

* * * * *